United States Patent
Kuo

(10) Patent No.: US 7,548,423 B2
(45) Date of Patent: Jun. 16, 2009

(54) HEAT DISSIPATING DEVICE

(75) Inventor: Szu-Wei Kuo, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/862,201

(22) Filed: Sep. 27, 2007

(65) Prior Publication Data

US 2008/0239670 A1 Oct. 2, 2008

(30) Foreign Application Priority Data

Apr. 2, 2007 (TW) .............................. 96111608 A

(51) Int. Cl.
*H05K 7/20* (2006.01)
*F28F 7/00* (2006.01)

(52) U.S. Cl. ....................... 361/697; 165/121; 165/122; 165/80.3; 361/704

(58) Field of Classification Search ......... 165/121–122; 361/697
See application file for complete search history.

(56) References Cited

U.S. PATENT DOCUMENTS

| 5,409,352 | A | * | 4/1995 | Lin | ............................. 415/177 |
| 5,519,575 | A | * | 5/1996 | Chiou | ......................... 361/697 |
| 5,582,506 | A | * | 12/1996 | Hong | ......................... 415/177 |
| 6,069,794 | A | * | 5/2000 | Chuang | ....................... 361/697 |
| 6,109,340 | A | * | 8/2000 | Nakase et al. | ............... 165/80.3 |
| 6,282,091 | B1 | * | 8/2001 | Horng | ......................... 361/697 |
| 6,434,002 | B1 | * | 8/2002 | Wei | ............................. 361/697 |
| 7,117,932 | B2 | * | 10/2006 | Ku et al. | ...................... 165/121 |
| 2003/0102110 | A1 | * | 6/2003 | Wagner | ....................... 165/80.3 |

* cited by examiner

*Primary Examiner*—Gregory D Thompson
(74) *Attorney, Agent, or Firm*—Frank R. Niranjan

(57) ABSTRACT

A heat dissipating device includes a heat sink, and a fan. The heat sink includes an end plane, and an engaging portion is defined in a middle of the end plane. The fan includes a frame, and an impeller mounted in the frame. The frame includes an end surface. A protrusion extends from a middle of the end surface of the frame for engaging in the engaging portion of the heat sink, such that the fan is fixed to the heat sink.

7 Claims, 4 Drawing Sheets

HEAT DISSIPATING DEVICE

BACKGROUND

1. Field of the Invention

The present invention relates to heat dissipating devices.

2. Description of Related Art

An equipment chassis, such as a computer chassis, usually includes a heat sink, and a fan installed on an electronic component thereof for dissipating heat. Typically, the fan defines a plurality of fixing holes in four corners of a frame thereof. A fixing member is fixed to fins of the heat sink, and a plurality of through holes is defined in the fixing member corresponding to the fixing holes of the fan. A plurality of screws is extended through the corresponding fixing holes of the fan and engages in the corresponding through holes of the fixing member, thereby the fan is fixed to the heat sink. However, the screws have to be removed to detach the fan from the heat sink, which is troublesome and a waste of time.

What is needed, therefore, is a heat dissipating device which is able to be mounted and detached easily.

SUMMARY

An exemplary heat dissipating device includes a heat sink, and a fan. The heat sink includes an end plane, and an engaging portion is defined in a middle of the end plane. The fan includes a frame, and an impeller mounted in the frame. The frame includes an end surface. A protrusion extends from a middle of the end surface of the frame for engaging in the engaging portion of the heat sink, such that the fan is fixed to the heat sink.

Other advantages and novel features will become more apparent from the following detailed description of embodiments when taken in conjunction with the accompanying drawings, in which:

DETAILED DESCRIPTION

Figure 1:
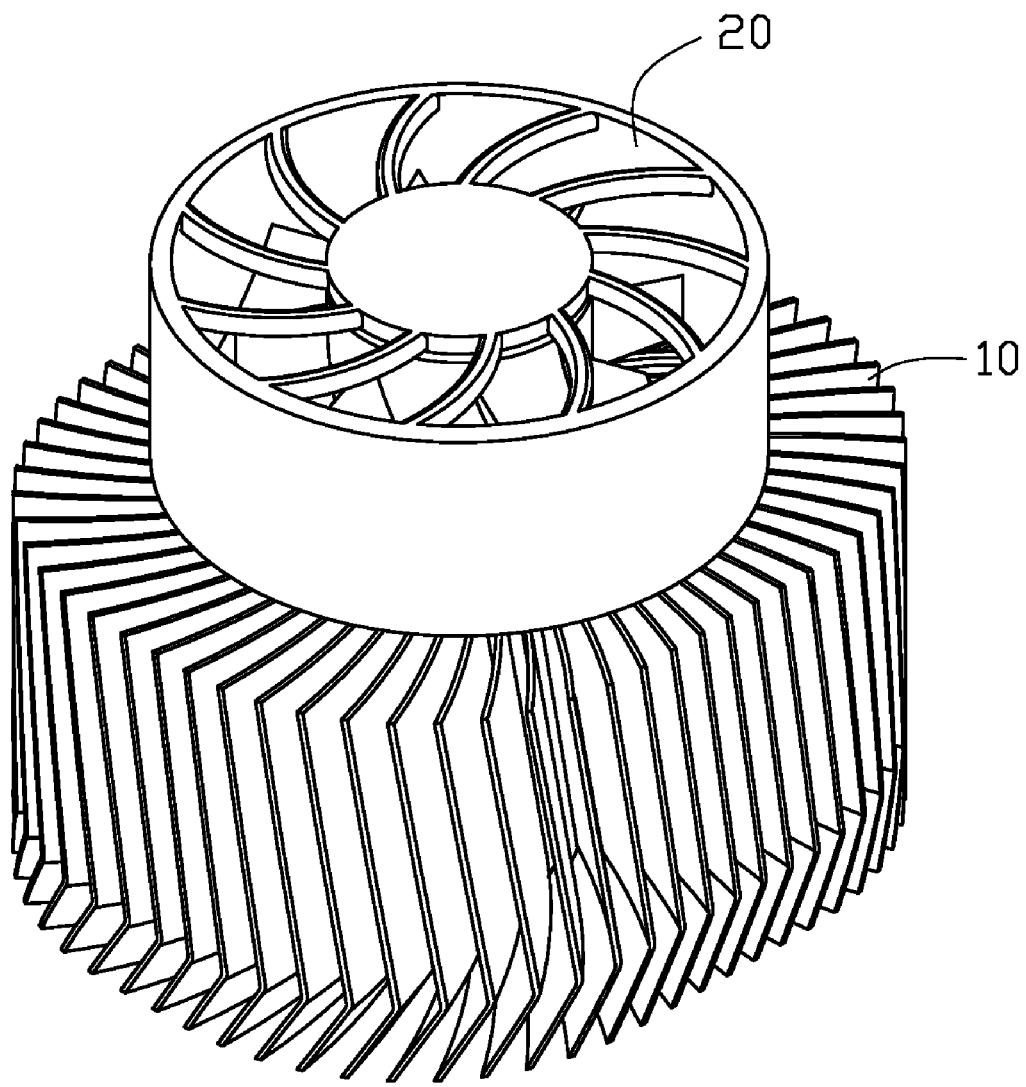
FIG. 1 is an assembled, isometric view of a heat dissipating device in accordance with an embodiment of the present invention.
Figure 2:
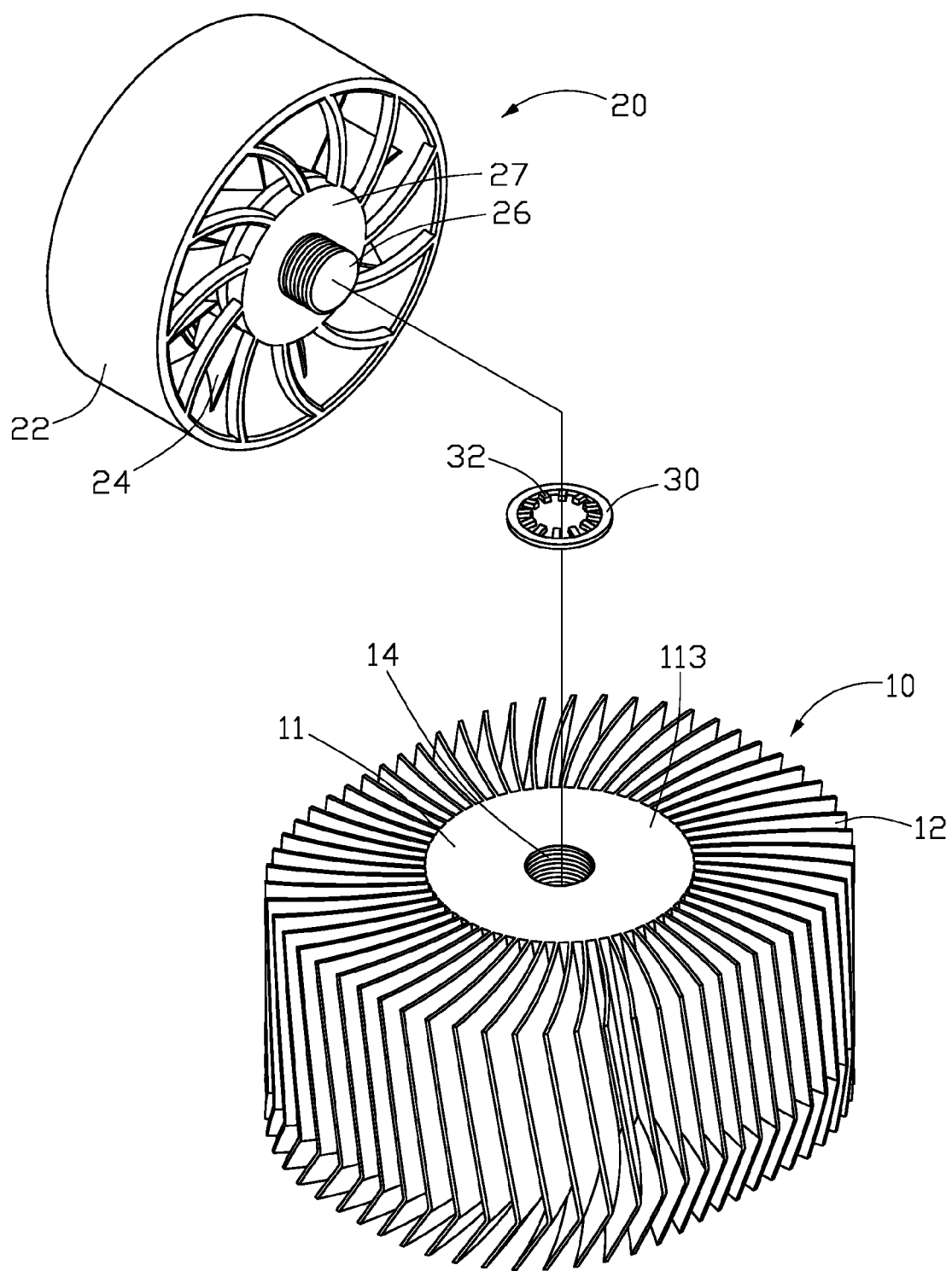
FIG. 2 is an exploded, isometric view of FIG. 1, the heat dissipating device includes a heat sink, a fan, and a gasket.

Referring to FIGS. 1 and 2, a heat dissipating device is provided in accordance with a first embodiment of the present invention. The heat dissipating device includes a heat sink 10, a fan 20, and a gasket 30.

The heat sink 10 includes a columnar main body 11 having two end planes 113, and a plurality of fins 12 radially projecting from a circumference of the main body 11. An engaging portion 14 is defined in the middle of one of the end planes 113 of the main body 11. In this embodiment, the engaging portion 14 is a threaded hole.

The fan 20 includes a frame 22 having two opposite end surfaces 27, and an impeller 24 mounted in the frame 22 between the end surfaces 27. A protrusion 26 extends from a middle of one of the end surfaces 27. In this embodiment, the protrusion 26 is a threaded rod.

Figure 3:
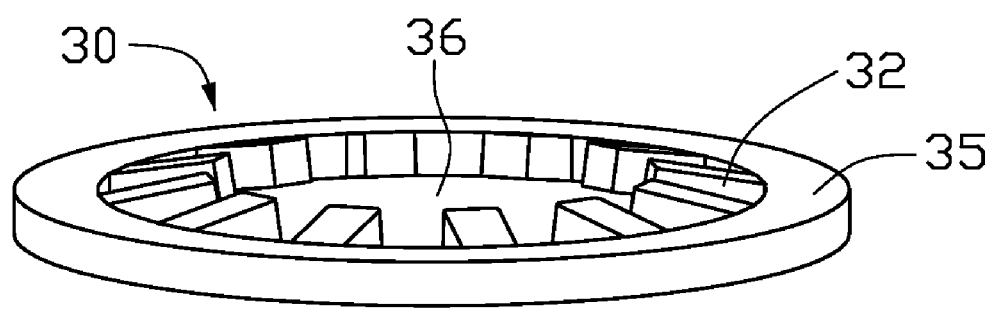
FIG. 3 is an isometric view of the gasket of FIG. 2, but viewed from another aspect.

Referring to FIG. 3, the gasket 30 includes a pair of contacting surfaces 35, and defines a through hole 36 in a middle section thereof. A plurality of elastic portions 32 protrudes inward and obliquely from an inside surface of the gasket 30. Thus, the elastic portions 32 are inclined to a plane defined by the radii of the gasket 30 at an acute angle and extend beyond one of the contacting surfaces 35 in the axis direction of the through hole 36.

Referring back to FIGS. 1 and 2, in assembly, the protrusion 26 of the fan 20 is extended through the through hole 36 of the gasket 30 and engages in the engaging portion 14 of the heat sink 10. The fan 20 is fixed to the heat sink 10 and tightly presses the elastic portions 32 of the gasket 30. The gasket 30 sandwiched between the fan 20 and the heat sink 10 is able to dampen vibration and noise during use.

Figure 4:
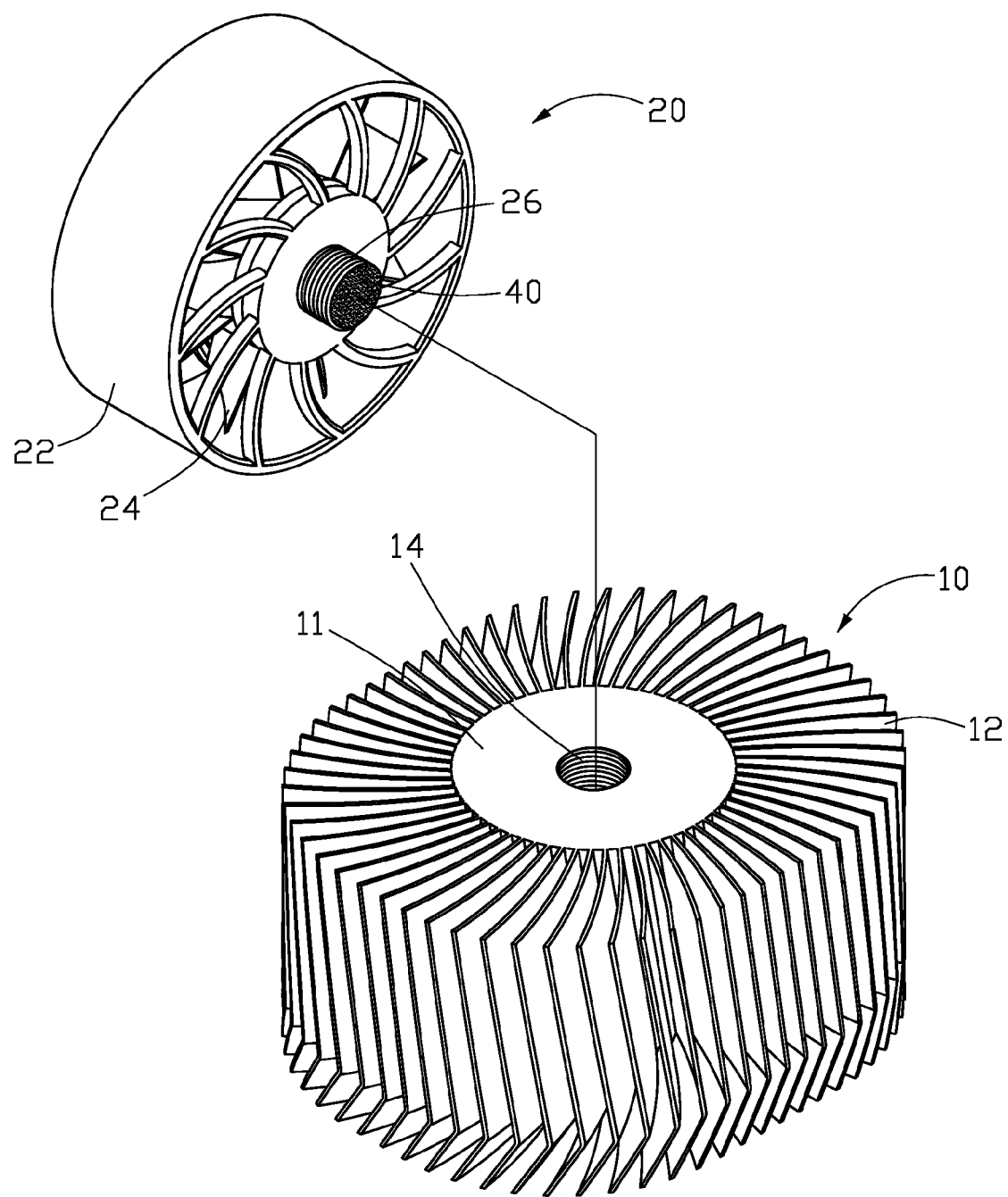
FIG. 4 is an exploded, isometric view of a heat dissipating device in accordance with another embodiment of the present invention.

Referring to FIG. 4, in another embodiment, the gasket 30 of the first embodiment is omitted. A Teflon paste 40 is spread on a free end of the protrusion 26 of the fan 20. When the protrusion 26 engages in the engaging portion 14 of the heat sink 10, the free end of the protrusion 26 is stuck to the engaging portion 14 by the Teflon paste 40, which is able to absorb vibration of the fan 20 and firmly fix the fan 20 to the heat sink 10.

It is believed that the present embodiments and their advantages will be understood from the foregoing description, and it will be apparent that various changes may be made thereto without departing from the spirit and scope of the invention or sacrificing all of its material advantages, the example hereinbefore described merely being preferred or exemplary embodiments of the invention.

What is claimed is:

1. A heat dissipating device comprising:
   a heat sink comprising an end plane, an engaging portion defined in a middle of the end plane of the heat sink; and
   a fan comprising a frame, and on impeller rotatably mounted in the frame, the frame comprising an end surface, and a protrusion extending from a middle of the end surface for engaging in the engaging portion of the heat sink, such that the fan is fixed to the heat sink, wherein a teflon paste is located on a free end of the protrusion of the frame of the fan for attaching the free end of the protrusion to the engaging portion and adsorbing vibration of the fan.

2. The heat dissipating device as claimed in claim 1, wherein the engaging portion is a threaded hole, and the protrusion is a treaded rod capable of screwing into the threaded hole.

3. A heat dissipating device comprising:
   a heat sink comprising an end plane defining an engaging portion therein;
   a fan comprising a frame having an end surface, a protrusion extending from the end surface of the frame for engaging in the engaging portion of the heat sink so as to fix the fan to the heat sink; and
   a gasket mounted between the fan and the heat sink to absorb vibration therebetween, wherein the gasket defines a through hole therein for allowing the protrusion of the frame of the fan to be extended therethrough.

4. The heat dissipating device as claimed in claim 3, wherein the engaging portion is a threaded hole, and the protrusion is a threaded rod capable of screwing into the threaded hole.

5. The heat dissipating device as claimed in 3, wherein the gasket comprises a pair of contacting surfaces configured to contact with the end surface of the frame of the fan and end plane of the heat sink respectively, a plurality of elastic portions protrudes inward and obliquely from an inside surface of the gasket bounding the through hole, the elastic portions extending beyond one of the contact surfaces in the axis direction of the through hole of the gasket.

6. The heat dissipating device as claimed in claim 3, wherein the heat sink comprises a columnar main body and a plurality of fins extending radially from the main body, the end plane of the heat sink being formed at an end of to main body and being perpendicular to the axis of the main body.

7. The heat dissipating device as claimed in claim 3, wherein the fan further comprises an impeller rotatably mounted in the frame.

* * * * *